(12) United States Patent
Wege et al.

(10) Patent No.: US 7,544,270 B2
(45) Date of Patent: Jun. 9, 2009

(54) APPARATUS FOR PROCESSING A SUBSTRATE

(75) Inventors: Stephan Wege, Dresden (DE); Roger-Michael Wolf, Dresden (DE)

(73) Assignee: Infineon Technologies AG, Munich (DE)

(*) Notice: Subject to any disclaimer, the term of this patent is extended or adjusted under 35 U.S.C. 154(b) by 409 days.

(21) Appl. No.: 11/273,244

(22) Filed: Nov. 14, 2005

(65) Prior Publication Data

US 2007/0111339 A1    May 17, 2007

(51) Int. Cl.
*H01L 21/00*    (2006.01)
*C23C 16/00*    (2006.01)

(52) U.S. Cl. .................. 156/345.51; 156/345.43; 118/723 R

(58) Field of Classification Search .................. 156/915
See application file for complete search history.

(56) References Cited

U.S. PATENT DOCUMENTS

| | | | |
|---|---|---|---|
| 5,716,486 A * | 2/1998 | Selwyn et al. | 156/345.28 |
| 6,074,488 A | 6/2000 | Roderick et al. | |
| 6,184,489 B1 * | 2/2001 | Ito et al. | 219/121.43 |
| 6,475,918 B1 * | 11/2002 | Izawa et al. | 438/714 |
| 6,624,084 B2 * | 9/2003 | Maeda et al. | 438/732 |
| 6,709,547 B1 * | 3/2004 | Ni et al. | 156/345.51 |
| 6,726,799 B2 * | 4/2004 | Koike | 156/345.24 |
| 2004/0149389 A1 * | 8/2004 | Fink | 156/345.51 |

FOREIGN PATENT DOCUMENTS

| | | | |
|---|---|---|---|
| JP | 2002261084 A | * | 9/2002 |
| KR | 2004050079 A | * | 6/2004 |

* cited by examiner

*Primary Examiner*—Parviz Hassanzadeh
*Assistant Examiner*—Michelle Crowell
(74) *Attorney, Agent, or Firm*—Slater & Matsil, L.L.P.

(57) ABSTRACT

An apparatus includes a plasma process chamber and a support element capable of supporting a substrate inside the plasma process chamber. At least one plasma control element is placed adjacent to a peripheral portion of the support element such that the plasma control element is capable of influencing a plasma inside the plasma process chamber if an electric field is applied thereto. At least one voltage generator is connected to the plasma control element. The plasma control element is movable inside the process chamber such that it can be set to any of at least two different positions.

23 Claims, 5 Drawing Sheets

APPARATUS FOR PROCESSING A SUBSTRATE

TECHNICAL FIELD

The present invention relates to an apparatus with a plasma process chamber adapted to process a substrate.

BACKGROUND

An apparatus including a plasma process chamber is described in U.S. Pat. No. 6,074,488, which is incorporated herein by reference. This apparatus comprises a process chamber with a support assembly. The support assembly contains a dielectric member as a support element that is adapted to carry a substrate during processing. The support assembly further comprises a collar that encircles the support element. A voltage with a radio frequency (RF) is applied to the collar in order to influence the plasma distribution near a peripheral portion of the support element. In this way, the processing of the substrate is modified.

SUMMARY OF THE INVENTION

In one aspect, the present invention further improves the uniformity of the plasma distribution near the substrate's surface and further improves the results of a plasma related process.

In a second aspect, the present invention provides an apparatus that easily adapts the plasma distribution inside the process chamber to a variety of different process conditions and to a variety of different plasmas.

In a third aspect, the present invention provides an apparatus that generates an asymmetric plasma distribution inside the plasma chamber if an asymmetric process is required.

According to one embodiment of the present invention, the apparatus includes a support element capable of supporting a substrate in a plasma process chamber and at least one plasma control element being placed adjacent a peripheral portion of the support element. The plasma control element is capable of influencing a plasma inside the plasma process chamber if an electric field is applied thereto. Further, the plasma control element is movably disposed inside the process chamber such that it can be brought to any of at least two different positions.

One advantage of various embodiments of the invention is that the plasma distribution inside the plasma process chamber can be varied over a very wide range as, in contrast to prior art plasma process chambers, the position of the plasma control element can be mechanically adjusted as necessary to achieve the requested plasma behavior. The plasma distribution may even be asymmetric if the position of the plasma control element is chosen accordingly.

According to a first preferred embodiment of the invention, the plasma control element forms a collar that encircles the support element. Preferably, the collar is rotationally symmetric. Such a configuration is advantageous, if a symmetric plasma distribution is requested.

According to a second preferred embodiment of the invention a plurality of plasma control elements are arranged adjacent to the peripheral portion of the support element in a symmetric configuration. Preferably the position of each plasma control element is individually adjustable in order to give the opportunity to influence the plasma in an asymmetric fashion. By asymmetrically influencing the plasma, a residual unwanted asymmetry inside the plasma process chamber may be compensated or a new asymmetry may be induced in a controlled manner.

Each of the plurality of plasma control elements may be formed as a ring segment such that the ring segments encircle the support element in a collar-like configuration. A collar-like configuration allows manipulation of the plasma distribution inside the chamber uniformly over a range of 360 degrees.

According to a third preferred embodiment of the invention, at least one of the plasma control elements comprises a piezo-electric element capable of modifying the geometric configuration of the plasma control element. Changing the geometric configuration may include changing the form of the plasma control element and/or the position of the plasma control element. For example, the piezo-electric element may bend the plasma control element such that its surface is modified and such that the plasma distribution is influenced. A piezo-electric element is easy to handle and can be controlled from the outside of the plasma process chamber by simply applying an appropriate voltage thereto.

Preferably, the piezo-electric element comprises a piezo-electric foil disposed inside or outside the plasma control element. As very thin piezo-electric foils are technically availably, the foil can easily be integrated inside or outside the plasma control element without remarkably enhancing the weight or the overall size of the plasma control element.

According to a fourth preferred embodiment of the invention, the plasma control element is movably disposed such that its position can be adjusted in a direction perpendicular to the upper surface of the support element and perpendicular to the substrate's surface. Preferably, the plasma control element can also be adjusted in a plane being parallel to the substrate's surface in order to further manipulate the plasma distribution as necessary.

BRIEF DESCRIPTION OF THE DRAWINGS

In order that the manner in which the above-recited and other advantages and objects of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

Figure 1:
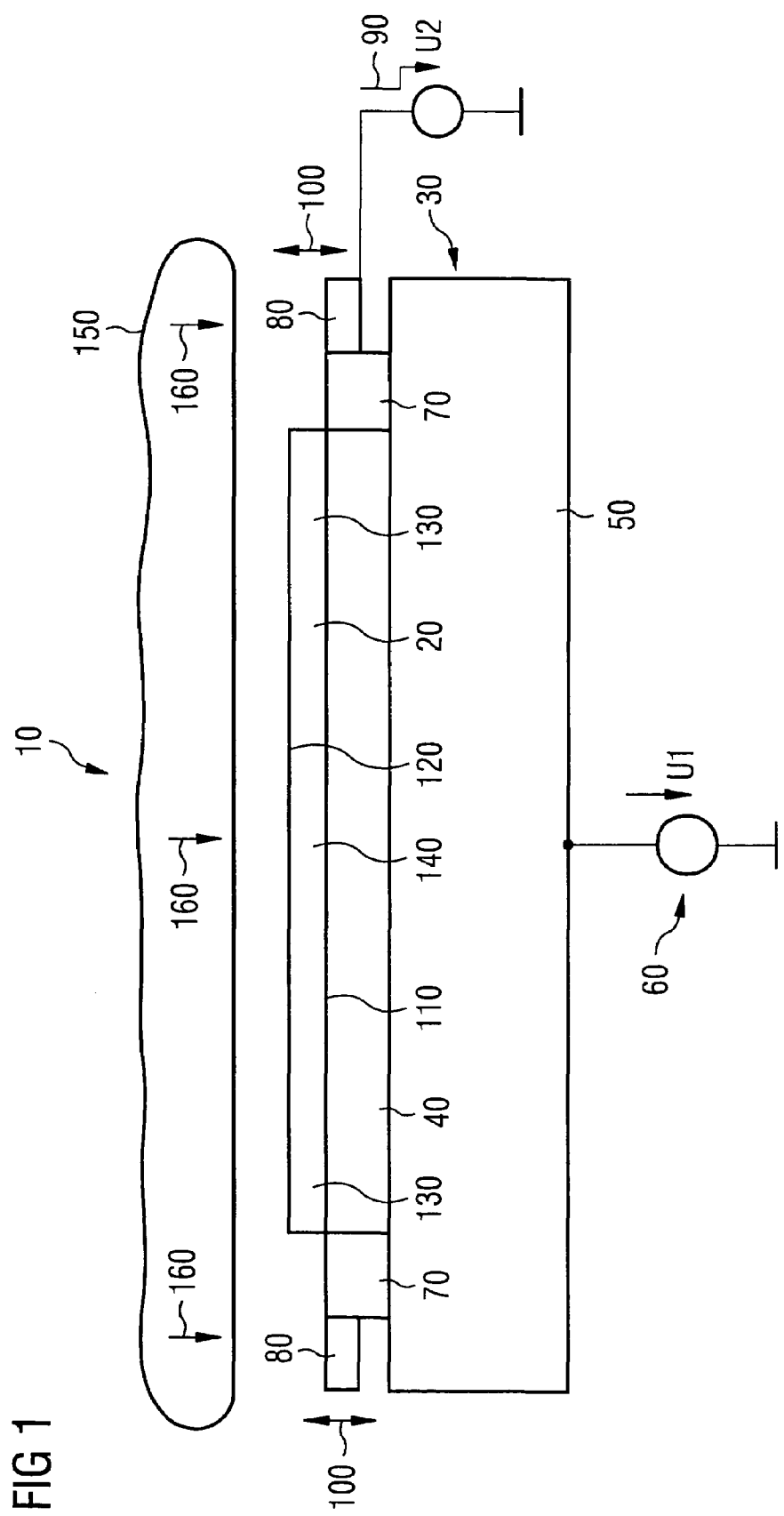
FIGS. 1-2 show a first embodiment of the invention including a single focus ring as a plasma control element.

The following list of reference symbols can be used in conjunction with the figures:
10 plasma process chamber
20 substrate
30 support element
40 electro-static chuck
50 cathode
60 voltage source
70 insulator ring
80 plasma control element
80a-80d plasma control element
90 voltage source 100 arrows
110 surface of support member
120 surface of substrate
130 peripheral portion
140 center portion
150 plasma distribution
160 plasma distribution
200 plasma control element
210 plasma control element
230 outer side area
300 plasma control element
310 piezo-electric foil

DETAILED DESCRIPTION OF ILLUSTRATIVE EMBODIMENTS

The preferred embodiments of the present invention will be best understood by reference to the drawings, wherein like parts are designated by like numerals throughout.

It will be readily understood that the apparatus of the present invention, as generally described and illustrated in the figures herein, could vary in a wide range of different features. Thus, the following more detailed description of the embodiments of the present invention, as represented in FIGS. 1-7 is not intended to limit the scope of the invention, as claimed, but is merely representative of presently preferred embodiments of the invention.

FIG. 1 shows a first exemplary embodiment of the invention in a side view. According to this embodiment, an apparatus with a plasma process chamber 10 is adapted to process a substrate 20. The substrate 20 is carried by a support element 30. The support element 30 comprises an electro-static chuck 40 which fixes the substrate's position, and a cathode 50 that is controlled by a first voltage source 60 that applies a voltage U1. Plasma process chambers including an electro-static chuck may have different configurations and may be made of a variety of materials as disclosed in the above mentioned U.S. Pat. No. 6,074,488, which is incorporated herein by reference (including all the references mentioned therein).

Preferably, the first voltage source 60 generates an alternating voltage U1 (or current) with at least one radio frequency. For example, the first voltage source 60 may generate two frequencies, one of about 2 MHz and second one of about 60 MHz as indicated in the following equation:

$$U1 = A1*\sin(2*\pi*f1*t) + A2*\sin(2*\pi*f2*t+\phi),$$

wherein A1 and A2 designate the amplitudes of a first voltage signal (frequency f1, f1=2 MHz) and a second voltage signal (frequency f2, f2=60 MHz), respectively, and wherein φ designates a phase difference between both signals.

The electro-static chuck 40 is encircled by an insulator ring 70 that separates the electro-static chuck 40 from a plasma control element 80. According to the exemplary example of FIG. 1, the plasma control element 80 is realized by a focus ring that is coupled to a second voltage source 90 that can apply any kind of electric voltage or current to the focus ring 80. Preferably, the second voltage source 90 generates a RF (radio frequency) voltage U2 with a frequency and/or amplitude smaller than the highest frequency and/or smaller than the largest amplitude provided by the first voltage source 60. Also, a DC voltage may be applied to the plasma control element 80. In the latter case, the DC voltage is preferably smaller than a DC voltage applied to the cathode 50. For example, the second voltage source 90 supplies a voltage with a frequency in the range between 10 MHz and 20 MHz (preferably of 13,56 MHZ).

In the exemplary example of FIG. 1, two separate voltage sources 60 and 90 are shown. Of course, the support element 30 and the focus ring 80 could alternatively be controlled by the same voltage source.

As indicated in FIG. 1 by arrows 100, the focus ring 80 can be vertically adjusted. Accordingly, the relative position of the focus ring 80 perpendicular to the upper surface 110 of the support element 40 and perpendicular to the substrate's surface 120 may be changed in order to achieve a plasma distribution that provides the requested process results. For instance, if the plasma etches the substrate, the focus ring 80 can be adjusted such that the etch rate at the peripheral portion 130 of the substrate 20 is larger or smaller than the etch rate in the center portion 140 of the substrate 20. Of course, the focus ring 80 may also be adjusted such that the etch rate is homogeneous over the entire substrate 20.

FIG. 1 also visualizes the plasma distribution 150. It can be seen, that the vertical position of the focus ring 80 is adjusted such that the whole surface 120 of the substrate 20 will be processed homogeneously.

Figure 2:
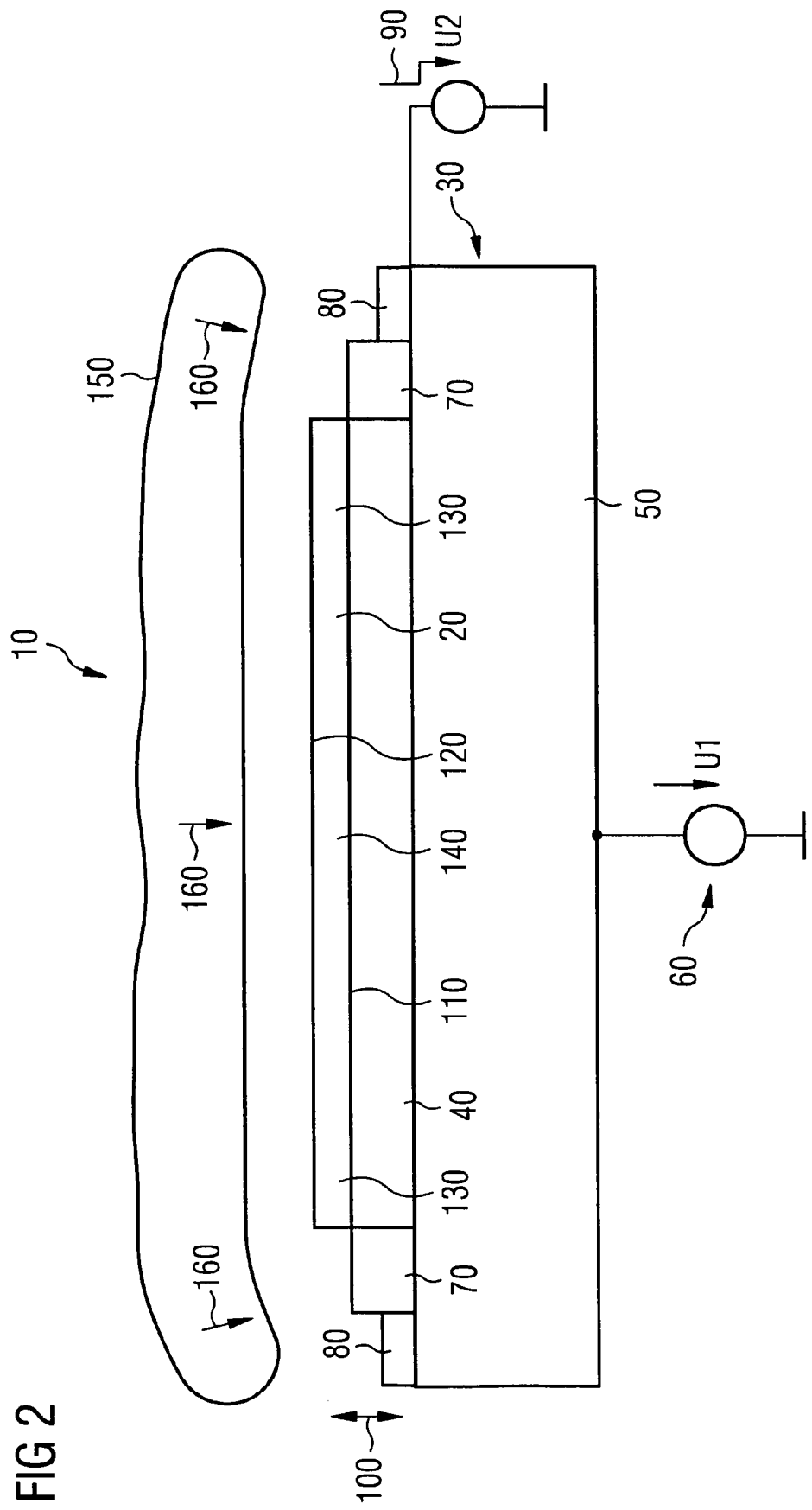

FIG. 2 shows another position of the focus ring 80. The focus ring 80 is in a lower position with respect to the surface 110 of the support element 30. Accordingly, the angle of incidence of the plasma ions onto the substrate's surface 120 is changed at the peripheral portion 130 of the substrate 20 and the plasma distribution is modified accordingly. This effect is visualized by arrows 160 (see also FIG. 1 for comparison). The modification of the plasma distribution clearly leads to a modified process result.

The sidewalls of the focus ring 80 and the sidewalls of the cathode 50 may be covered by an insulating cover layer. However, such a cover layer is not explicitly shown in the figures for the purpose of clarity.

Figure 3:
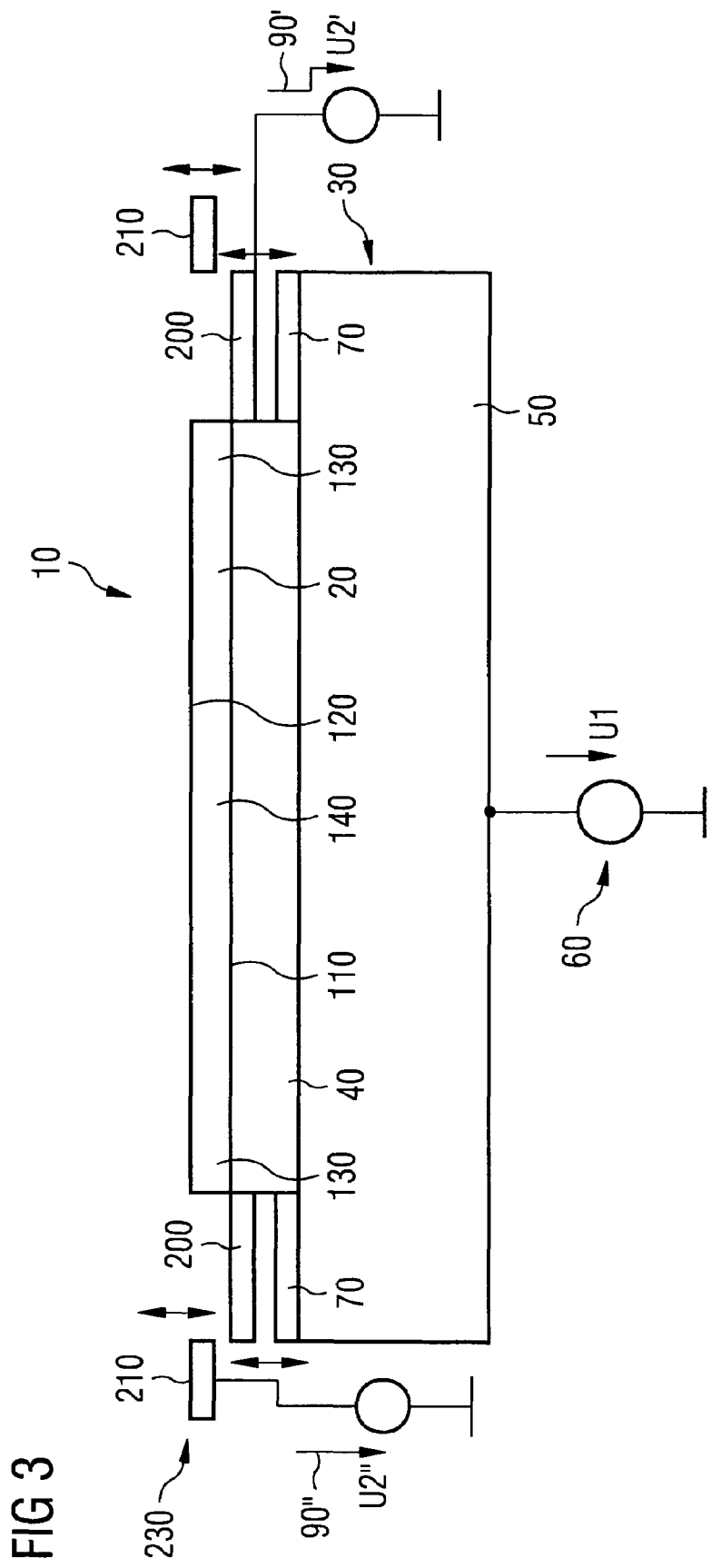
FIG. 3 shows a second embodiment of the invention with two separate focus rings in a concentric configuration.

FIG. 3 shows a second exemplary embodiment of the invention in a side view. In contrast to the first embodiment, the apparatus comprises two concentrically disposed plasma control elements 200 and 210, both formed as focus rings. The inner focus ring 200 separates the outer ring 210 from the electro-static chuck 40.

Both focus rings 200 and 210 are vertically adjustable in an individual fashion such that the plasma distribution can be influenced more accurately as compared to the embodiment of FIGS. 1 and 2.

The plasma distribution on the peripheral portion 130 of the substrate 20 is mainly influenced by the position of the inner focus ring 200, whereas the outer ring 210 mainly influences the plasma behavior, such as the plasma flow, at the outer side area 230 of the whole unit consisting of the support element 30 and both focus rings 200 and 210.

The inner ring 200 which is disposed above the insulator ring 70, and the outer ring 210 are individually controlled by two independent voltage sources 90' and 90" which supply currents and/or voltages U2' and U2", respectively. Each of these voltage sources 90' and 90" can provide voltages (i.e., DC and/or AC voltages) independently. For example, both voltage sources may supply radio frequencies in the range between 10 MHz and 20 MHz (e.g., of about 13.56 MHz) that may be in phase or phase-shifted relative to another.

In the exemplary example of FIG. 3, two separate voltage sources 90 and 90" are shown. Of course, both focus rings 200 and 210 could alternatively be controlled by the same voltage source.

Figure 4:
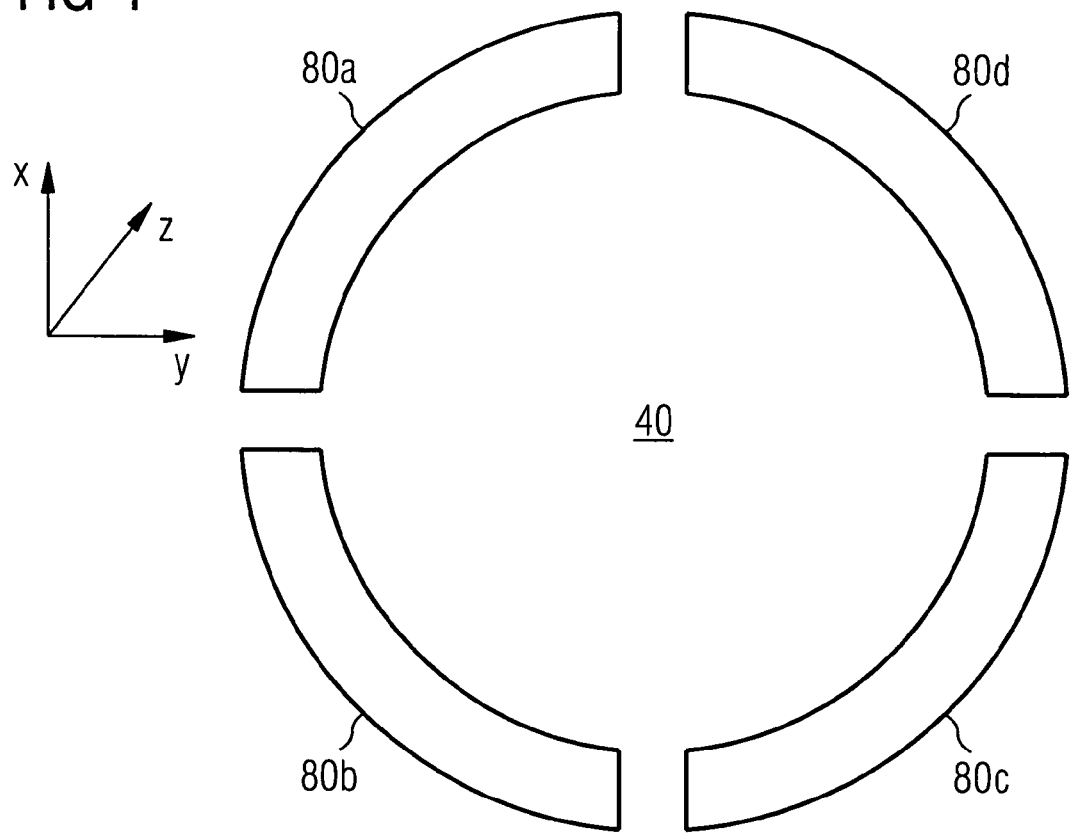
FIG. 4 shows a third embodiment of the invention with four ring segments as plasma control elements.

FIG. 4 shows a third exemplary embodiment of the invention in a top view. In contrast to the first and second embodiment, a plurality of plasma control elements 80a, 80b, 80c, 80d are arranged adjacent to the electro-static chuck 40 in a symmetric configuration. Each of the plurality of plasma control elements is formed as a ring segment such that the plasma control elements encircle the electro-static chuck 40 in a collar-like configuration.

Preferably, the mechanical position of each segment can be individually adjusted vertically and laterally (i.e., in x-, y- and z-direction). Additionally, an individual voltage (i.e., with individual frequencies and/or individual amplitudes) may be supplied to each of the ring segments such that each ring segment can be controlled individually. Therefore, any kind of symmetric or asymmetric plasma distribution may be obtained by modifying the electric field above the substrate 20 accordingly.

FIG. 4 shows four ring segments for influencing the plasma distribution. Alternatively, more or less ring segments could be used. Of course, if the number of individually controlled ring segments is larger, the adjustment of the plasma distribution can be more accurate.

Ring segments as shown in FIG. 4 can also be used in a double ring structure as shown in FIG. 3. Accordingly, inner ring segments would form an inner collar-like configuration and outer ring segments would form an outer collar-like configuration.

Figure 5:
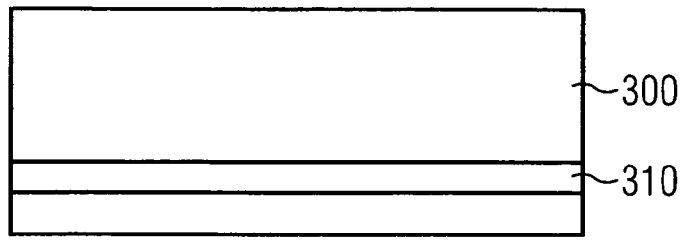
FIGS. 5, 5a, 6, and 7 show further embodiments of the invention including a plasma control element with a piezo-electric foil.
Figure 5A:
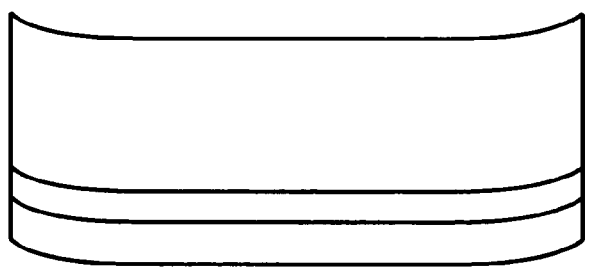

FIG. 5 shows a plasma control element 300 of a fourth exemplary embodiment of the invention in a side view. The plasma control element 300 comprises a piezo-electric foil 310 integrated inside the plasma control element 300. By applying a DC voltage to the piezo-electric foil 310, the plasma control element 300 will be bent or otherwise deformed, as illustrated, for example, in FIG. 5A. This provides another option for further modifying the plasma distribution inside the plasma process chamber 10. Accordingly, the plasma distribution can be influenced by: a) mechanically changing the position of the plasma control element (as discussed above); b) applying a RF voltage to the plasma control element 300 that directly modifies the plasma distribution inside the plasma process chamber (as discussed above); and c) applying a DC voltage for modifying the outer form (geometry) of the plasma control element 300 and therefore its interaction with the plasma.

The plasma control element 300 as shown in FIG. 5 can be used as a ring segment as shown in FIG. 4. Preferably, all ring segments 80a-80d of FIG. 4 are equipped with a piezo-electric element that allows an individual modification of the outer geometry of each ring segment.

Figure 6:
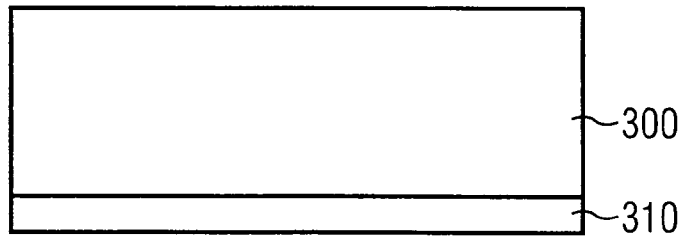
Figure 7:
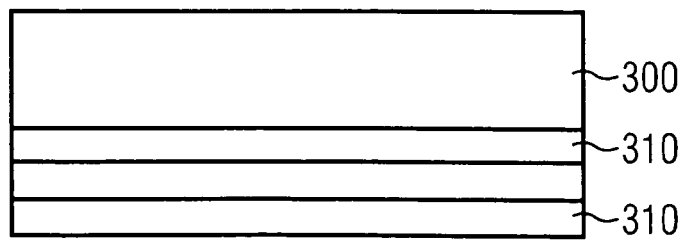

Even though FIG. 5 shows the piezo-electric foil 310 as an internal part of the plasma control element 300, such a foil 310 or any other kind of piezo-electric element may also be disposed at the outside of the plasma control element 300 (as shown in FIG. 6). Further, piezo-electric elements may be arranged inside and outside the plasma control element to increase the achievable amount of deformation (FIG. 7).

Alternatively, piezo-electric elements may exclusively be used to move the plasma control element. In this case, the outer form and geometry of the plasma control element remain unchanged und just the relative position of the plasma control element is adjusted with respect to the support element 30 (e.g., as shown in FIGS. 1-3).

In the above description, the term "voltage source" is used as a general term for all kinds of electric power sources (voltage sources and current sources).

What is claimed is:

1. An apparatus adapted to process a substrate, the apparatus comprising:
    a plasma process chamber;
    a support element capable of supporting the substrate inside the plasma process chamber;
    at least one plasma control element being placed adjacent to a peripheral portion of the support element such that the plasma control element is capable of influencing a plasma inside the plasma process chamber if an electric field is applied thereto, wherein the plasma control element is movable inside the plasma process chamber such that it can be set to any of at least two different positions; and
    at least one voltage generator that is connected to the plasma control element,
    wherein the plasma control element comprises a piezo-electric element capable of modifying the geometric configuration of the plasma control element, wherein the piezo-electric element comprises a first piezo-electric foil disposed inside the plasma control element and a second piezo-electric foil disposed at the outside of the plasma control element.

2. The apparatus according to claim 1, wherein the plasma control element forms a collar that encircles the support element.

3. The apparatus according to claim 2, wherein the collar is rotationally symmetric.

4. The apparatus according to claim 1, wherein the at least one plasma control element comprises a plurality of plasma control elements that are arranged adjacent to the peripheral portion of the support element in a symmetric configuration.

5. The apparatus according to claim 4, wherein the position of each plasma control element is individually adjustable.

6. The apparatus according to claim 5, wherein each of the plurality of plasma control elements comprises a ring segment and wherein the ring segments encircle the support element in a collar-like configuration.

7. The apparatus according to claim 6, wherein at least one of the ring segments includes a piezo-electric element capable of modifying the geometric configuration of the respective ring segment.

8. The apparatus according to claim 7, wherein the piezo-electric element comprises a piezo-electric foil disposed inside the ring segment.

9. The apparatus according to claim 8, wherein the ring segments are movable in a direction perpendicular to the substrate's surface.

10. The apparatus according to claim 9,
    wherein an inner radius of the collar-like configuration is larger than an outer radius of the support element; and
    wherein each ring segment is also movable in a plane being parallel to the substrate's surface.

11. The apparatus according to claim 1, wherein the piezo-electric element comprises a piezo-electric foil disposed at the outside of a ring segment.

12. The apparatus according to claim 1, wherein the plasma control element is movable in a direction perpendicular to the substrate's surface.

13. The apparatus according to claim 12, wherein the plasma control element is movable in a plane being parallel to the substrate's surface.

14. A support capable of supporting a substrate in a plasma process chamber, the support comprising:
    a support element capable of supporting the substrate in the plasma process chamber; and
    at least one plasma control element adjacent to a peripheral portion of the support element, wherein the plasma control element is capable of influencing a plasma inside the plasma process chamber if an electric field is applied thereto, and wherein the plasma control element is movable such that it can be set to any of at least two different positions, wherein the plasma control element comprises a piezo-electric element capable of modifying the geometric configuration of the plasma control element, wherein the piezo-electric element comprises a first piezo-electric foil disposed inside the plasma control element and a second piezo-electric foil disposed at the outside of the plasma control element.

15. The support according to claim 14, wherein the plasma control element comprises a plurality of plasma control elements that are arranged adjacent the peripheral portion of the support element in a symmetric configuration, and wherein each of the plurality of plasma control elements is formed as a ring segment such that the ring segments encircle the support element in a collar-like configuration.

16. The support according to claim 15, wherein the position of each ring segment is individually adjustable.

17. The support according to claim 14, wherein the plasma control element is movable in a direction perpendicular to the substrate's surface.

18. The support according to claim 17, wherein the plasma control element is also movable in a plane being parallel to the substrate's surface.

19. The support according to claim 14, wherein the piezo-electric element comprises a piezo-electric foil disposed outside of the plasma control element.

20. The support according to claim 14, wherein the support comprises an electro-static chuck.

21. The apparatus according to claim 1, wherein the at least one plasma control element comprises a single annular-shaped control element that surrounds a periphery of a location for the substrate.

22. The apparatus according to claim 1, wherein the at least one plasma control element comprises at least two concentrically arranged annular-shaped control elements that surround a periphery of a location for the substrate.

23. The apparatus according to claim 1, wherein a second piezo-electric foil is disposed at the outside of a ring segment.

* * * * *